United States Patent
Ahn et al.

(10) Patent No.: US 8,460,985 B2
(45) Date of Patent: Jun. 11, 2013

(54) METHOD OF MANUFACTURING SEMICONDUCTOR FOR TRANSISTOR AND METHOD OF MANUFACTURING THE TRANSISTOR

(75) Inventors: Bo-Kyoung Ahn, Incheon-si (KR); Seon-Pil Jang, Seoul (KR); Gug-Rae Jo, Asan-si (KR); Hong-Suk Yoo, Anyang-si (KR); Chang-Hoon Kim, Asan-si (KR); Min-Uk Kim, Seongnam-si (KR); Ju-Han Bae, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 392 days.

(21) Appl. No.: 12/829,977

(22) Filed: Jul. 2, 2010

(65) Prior Publication Data

US 2011/0124152 A1    May 26, 2011

(30) Foreign Application Priority Data

Nov. 20, 2009    (KR) .......................... 10-2009-0112818

(51) Int. Cl.
*H01L 21/336*  (2006.01)

(52) U.S. Cl.
USPC ................................. 438/165; 257/E21.461

(58) Field of Classification Search
USPC .. 438/104, 164, 165, 479, 795; 257/E21.461, 257/E21.471
See application file for complete search history.

(56) References Cited

U.S. PATENT DOCUMENTS

| 7,095,921 | B2 * | 8/2006 | Okazaki et al. ................. 385/31 |
| 7,402,506 | B2 | 7/2008 | Levy et al. |
| 2009/0068800 | A1 * | 3/2009 | Nelson et al. ................. 438/158 |
| 2009/0173938 | A1 * | 7/2009 | Honda et al. ................... 257/43 |
| 2010/0184253 | A1 * | 7/2010 | Hirai et al. .................... 438/104 |

FOREIGN PATENT DOCUMENTS

| JP | 2002-280324 | 9/2002 |
| JP | 2007-042689 | 2/2007 |
| JP | 2007-142451 | 6/2007 |
| JP | 2008-547195 | 12/2008 |
| JP | 2009-026852 | 2/2009 |
| JP | 2009-111125 | 5/2009 |
| KR | 100814901 | 3/2008 |
| KR | 1020080092663 | 10/2008 |
| KR | 1020080095603 | 10/2008 |
| KR | 1020090002841 | 1/2009 |
| WO | 2006/138071 | 12/2006 |

* cited by examiner

*Primary Examiner* — Wensing Kuo
(74) *Attorney, Agent, or Firm* — H.C. Park & Associates, PLC

(57) ABSTRACT

A method of manufacturing a semiconductor for a transistor that includes forming a precursor layer by coating a surface of an insulation substrate with a precursor solution for an oxide semiconductor, forming an oxide semiconductor by oxidizing a portion of the precursor layer, and removing a remaining precursor layer except for the oxide semiconductor.

13 Claims, 15 Drawing Sheets shown in FIG. 5, FIG. 6, and FIG. 7 and taken along the lines
METHOD OF MANUFACTURING SEMICONDUCTOR FOR TRANSISTOR AND METHOD OF MANUFACTURING THE TRANSISTOR

CROSS REFERENCE TO RELATED APPLICATION

This application claims priority from and the benefit of Korean Patent Application No. 10-2009-0112818, filed on Nov. 20, 2009, which is hereby incorporated by reference for all purposes as if fully set forth herein.

BACKGROUND OF THE INVENTION

1. Field of the Invention

Exemplary embodiments of the present invention relate to a method of manufacturing a semiconductor for a transistor.

2. Discussion of the Background

A thin film transistor (TFT) is used in various fields and is used particularly as switching and driving elements in a flat panel display such as a liquid crystal display (LCD), an organic light emitting device (OLED) display, and an electrophoretic display.

A TFT includes a gate electrode connected to a gate line transmitting a scanning signal, a source electrode connected to a data line transmitting a signal applied to a pixel electrode, a drain electrode facing the source electrode, and a semiconductor electrically connected to the source electrode and the drain electrode.

Among the TFT components, the semiconductor is an important factor in determining characteristics of the TFT. The semiconductor mainly includes silicon (Si). The silicon is divided into amorphous silicon and polysilicon according to a crystallization type, the amorphous silicon has a simple manufacturing process but has low charge mobility that may limit its use in manufacturing a high performance TFT. The polysilicon has high charge mobility but may require a crystallization process that is complicated and may cause the manufacturing process to be costly. To compensate for the amorphous silicon and the polysilicon used in TFT manufacture, an oxide semiconductor may be used.

Here, the oxide semiconductor is formed through vacuum deposition or sputtering, but the manufacturing process is complicated and the purchase cost of the TFT device increases as the size of a TFT substrate increases. Accordingly, application of the oxide semiconductor to a large display device is limited.

Also, if the substrate is heated to a high temperature during oxide semiconductor formation, the substrate (made of glass or plastic) may be bent or deformed.

The above information is for enhancement of understanding of the background of the invention and may contain information that does not form the prior art known to a person of ordinary skill in the art in this country.

SUMMARY OF THE INVENTION

Exemplary embodiments of the present invention provide an oxide semiconductor manufacturing method to simplify the manufacturing process and to reduce the manufacturing cost.

Exemplary embodiments of the present invention also provide an oxide semiconductor manufacturing method to minimize deformation of a substrate due to a heat treatment for forming an oxide semiconductor.

Additional features of the invention will be set forth in the description which follows, and in part will be apparent from the description, or may be learned by practice of the invention.

An exemplary embodiment of the present invention discloses a method of manufacturing a semiconductor for a transistor that comprises forming a precursor layer by coating a surface of a substrate with a precursor solution for an oxide semiconductor; forming the oxide semiconductor by oxidizing a portion of the precursor layer; and removing a remaining precursor layer except for the oxide semiconductor.

An exemplary embodiment of the present invention also discloses a method of manufacturing a transistor that comprises forming a precursor layer by coating a surface of a substrate with a precursor solution for an oxide semiconductor; forming the oxide semiconductor by oxidizing a portion of the precursor layer; forming a gate electrode overlapping the oxide semiconductor; and forming a source electrode and a drain electrode overlapping the oxide semiconductor and facing the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
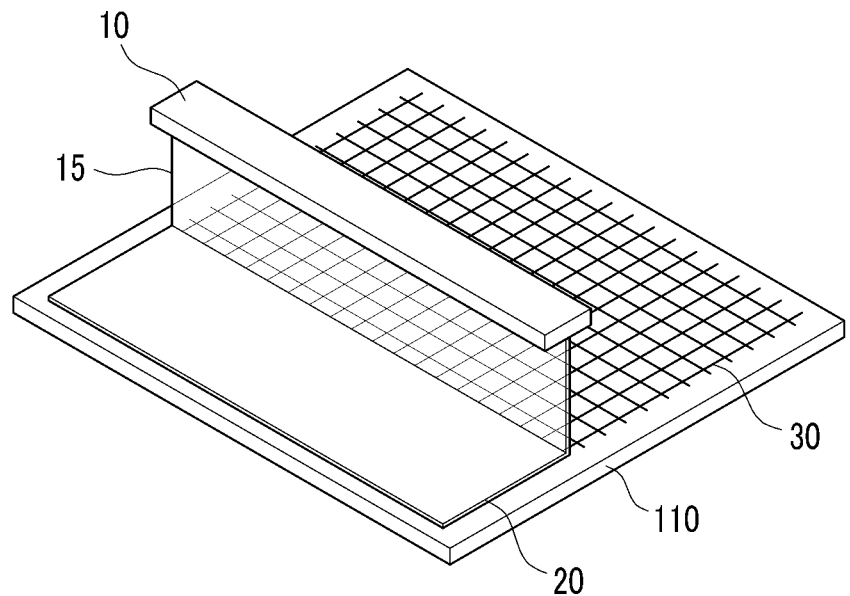
FIG. 1, FIG. 2, FIG. 3, and FIG. 4 are views sequentially showing a method for forming an oxide semiconductor by using a solution according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

A method for forming an oxide semiconductor according to an exemplary embodiment of the present invention will be described.

FIG. 1, FIG. 2, FIG. 3, and FIG. 4 are views sequentially showing a method for forming an oxide semiconductor by using a solution according to an exemplary embodiment of the present invention.

As shown in FIG. 1, a precursor solution is coated on an insulation substrate 110 made of transparent glass or plastic to form a precursor layer 20. Here, the precursor layer 20 has a thickness of more than 50 Å. When having a thickness of less 50 Å, the semiconductor characteristic of the transistor may not be obtained.

The substrate 100 includes a signal line 30 such as a gate line or a data line to be connected to the thin film transistor (TFT). However, the signal line 30 may be formed after forming the semiconductor according to the structure of the transistor such that the signal line 30 is selectively formed.

Also, the substrate 110 may be a mother substrate including cells for a plurality of liquid crystal displays, but only one cell is shown for convenience of description.

The precursor layer is formed from a precursor solution containing a metal compound. The metal compound may be in the form of a nitride, a salt, or a hydrate but is not limited thereto. For example, the salt may be an acetate, a carbonyl, a carbonate, a nitrate, a sulfate, a phosphate, or a halide.

The metal may include at least one metal selected from zinc (Zn), lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), aluminum (Al), gallium (Ga), indium (In), thallium (Tl), silicon (Si), germanium (Ge), tin (Sn), lead (Pb), phosphorus (P), arsenic (As), antimony (Sb), and bismuth (Bi). For example, when the metal includes zinc, it may be zinc acetate $(Zn(CH_3COO)_2)$, zinc nitrate, zinc acetylacetonate, zinc chloride, or a hydrate thereof.

The precursor solution may further include a solution stabilizer. The solution stabilizer may include at least one compound selected from an alcohol amine compound, an alkyl ammonium hydroxy compound, an alkyl amine compound, a ketone compound, an acid compound, a base compound, and deionized water, and, as an example, may further include at least one compound selected from monoethanolamine, diethanolamine, triethanolamine, monoisopropylamine, N,N-methylethanolamine, aminoethyl ethanolamine, diethyleneglycolamine, 2-(aminoethoxy)ethanol, N-t-butylethanolamine, N-t-butyldiethanolamine, tetramethylammoniumhydroxide, methylamine, ethylamine, acetylacetone, hydrochloric acid, nitric acid, sulfuric acid, acetic acid, ammonium hydroxide, potassium hydroxide, and sodium hydroxide.

The solution stabilizer may include a solution of the above-described components included in the precursor solution to form a uniform thin film. The content of the solution stabilizer may be changed according to the kind and the content of the above-described components, and the precursor solution may contain 0.01% to 30% (by volume) of the solution stabilizer. When the solution stabilizer is included in this range, the solubility of the metal compound may be increased.

The above-described metal compound and solution stabilizer are mixed with a solvent. The solvent may dissolve the above-described components and may be an alcohol compound. Further, the solvent may include at least one compound selected from methanol, ethanol, propanol, isopropanol, 2-methoxyethanol, 2-ethoxyethanol, 2-propoxyethanol, 2-buthoxyethanol, butadiol, methylcellosolve, ethylcellosolve, ethyleneglycol, diethyleneglycolmethylether, diethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyllactic acid, propyleneglycolmethyletheracetate, propyleneglycolmethylether, propyleneglycolpropylether, methylcellosolveacetate, ethylcellosolveacetate, diethyleneglycolmethylacetate, diethyleneglycolethylacetate, acetone, methylisobutylketone, cyclohexanone, dimethyl formamide (DMF), N,N-dimethyl acetamide (DMAc), N-methyl-2-pyrolidone, γ-butyrolactone, diethylether, ethyleneglycoldimethylether, diglyme, tetrahydrofuran, acetylacetone, and acetonitrile.

The solvent may be included with the remaining content except for the content of the above components for the total content of the precursor solution.

The precursor layer 20 may be formed by slit coating, area printing, or inkjet printing. In the slit coating, the solution is sprayed while a bar 10 including nozzles disposed at uniform intervals passes along the surface of the insulation substrate 110. A spray 15 is formed from the nozzles and impinges the surface of the insulation substrate 110. In the inkjet printing, the solution is dripped while moving an inkjet head over the insulation substrate 110, which is divided into a plurality of printing regions. The precursor solution is dripped in the printing regions. Any of spin coating, dip coating, bar coating, screen printing, slide coating, roll coating, spray coating, dip-pen nanolithography, and a method to spray the precursor solution such as a nano-dispensing may be used to introduce the precursor layer 20 onto the insulation substrate 110.

Figure 2:
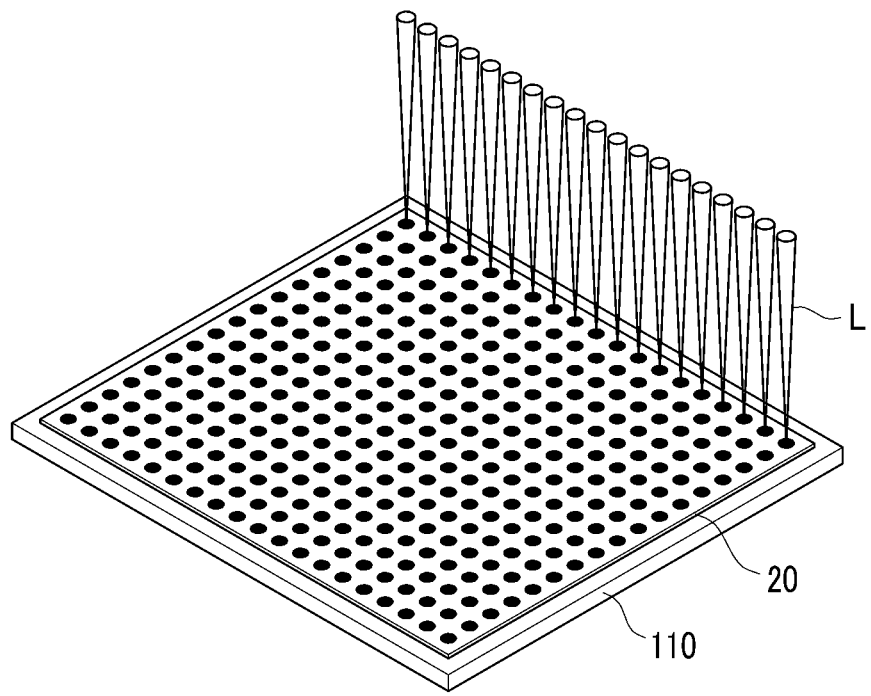

Next, as shown in FIG. 2, a heat treatment (a soft bake) is executed to remove the solvent included in the precursor layer 20. The heat treatment may be executed at a temperature of 90-110° C. for 80-100 seconds. The heat treatment is executed at a low temperature of about 100° C. so that the insulating substrate 110 is not bent or deformed.

Next, a laser L having a wavelength of more than 100 nm but less than 500 nm selectively irradiates a portion of the precursor layer 20 to form an oxide semiconductor of the TFT. The radiation incident to the precursor layer 20 does not cause deformation of the insulation substrate 110. The irradiated regions are disposed at uniform intervals, and the interval between irradiated regions is greater than several tens of times the area of a single irradiated region so that heat generated locally at an irradiated region does not transfer through the whole substrate.

Figure 3:
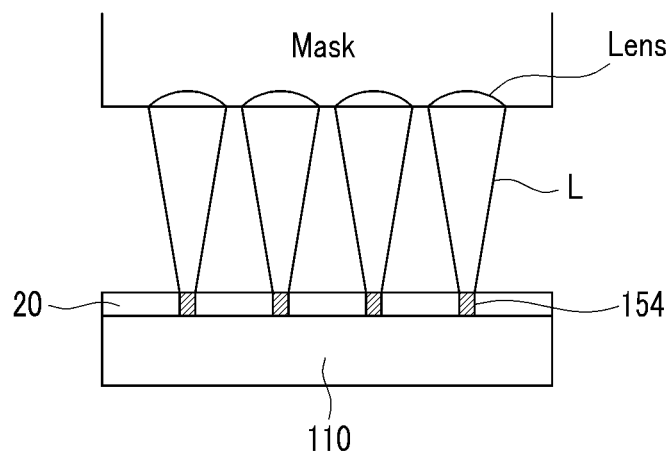

The laser L may be a diode laser, and, as shown in FIG. 3, the light is partially transmitted to the precursor layer 20 by passing the laser L through a mask of a light exposer. The mask has a microlens array such that the laser L may irradiate a small region of the precursor layer 20. That is, the microlens array may control a beam size of the laser L incident on the precursor layer 20 by selection of the size of the lens, and the laser L may be focused to an area 1/10 that of the lens area. For example, when the area of the lens is 200 μm, the area where the laser L is focused onto the precursor layer 20 may be 20 μm. In this way, if the laser L is collected into a smaller area than the lens, the light energy is collected such that the oxide semiconductor may be formed through less energy than in the conventional art.

Figure 4:
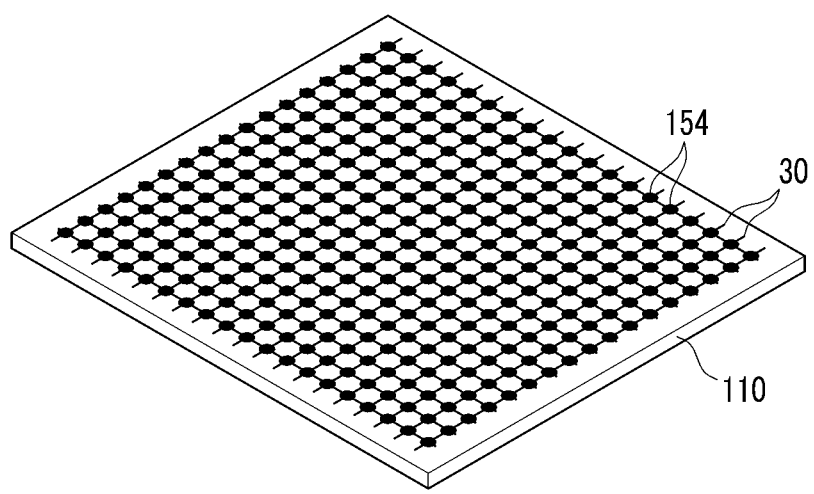

Next, as shown in FIG. 4, the insulation substrate 110 is cleaned to remove the precursor layer 20 except for the oxide semiconductor 154 so that only the oxide semiconductor 154 remains on the substrate 110. Here, it is preferable that the cleaning uses the solvent included in the precursor solution to selectively remove the precursor layer 20 around the oxide semiconductor 154.

The precursor solution may include at least one precursor according to the kind of the semiconductor to be formed and may also include at least one solvent. When using two or more solvents, the precursor layer is cleaned by a solvent mixture, and the cleaning may be repeatedly executed according to the kinds of the solvent included in the mixture solvent.

A TFT array panel for a liquid crystal display and a manufacturing method thereof using a method for forming an oxide semiconductor according to an exemplary embodiment of the present invention will now be described.

Figure 5:
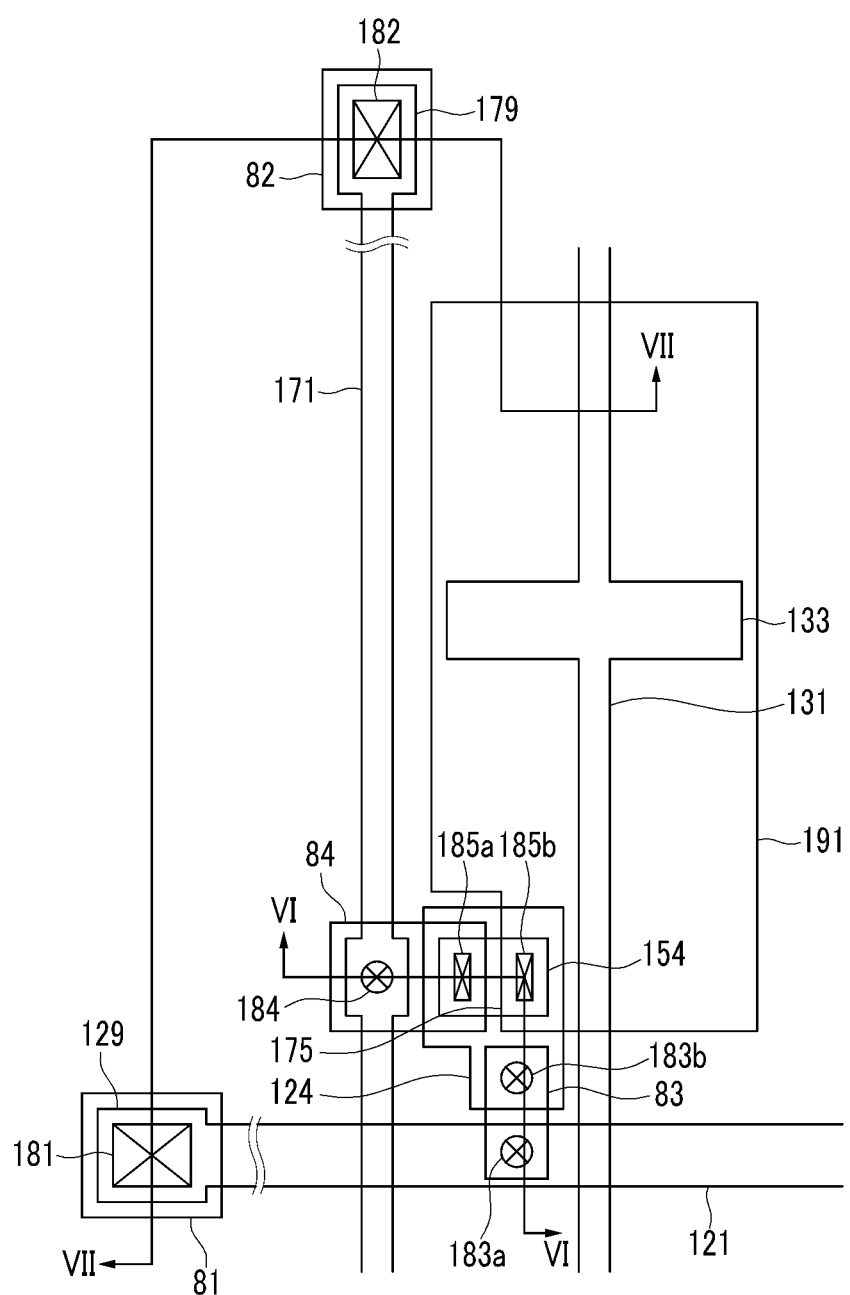
FIG. 5 is a layout view of a thin film transistor array panel according to an exemplary embodiment of the present invention.
Figure 6:
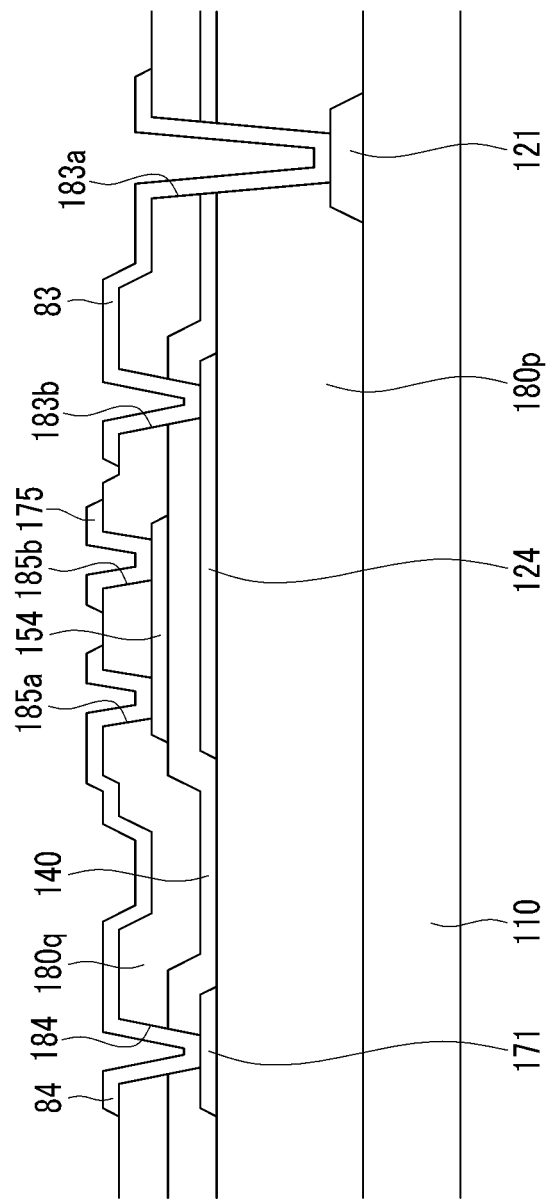
FIG. 6 is a cross-sectional view taken along the line VI-VI of FIG. 5.

FIG. 5 is a layout view of a TFT array panel according to an exemplary embodiment of the present invention; FIG. 6 is a cross-sectional view taken along the line VI-VI of FIG. 5; and FIG. 7 is a cross-sectional view taken along the line VII-VII of FIG. 5.

Figure 7:
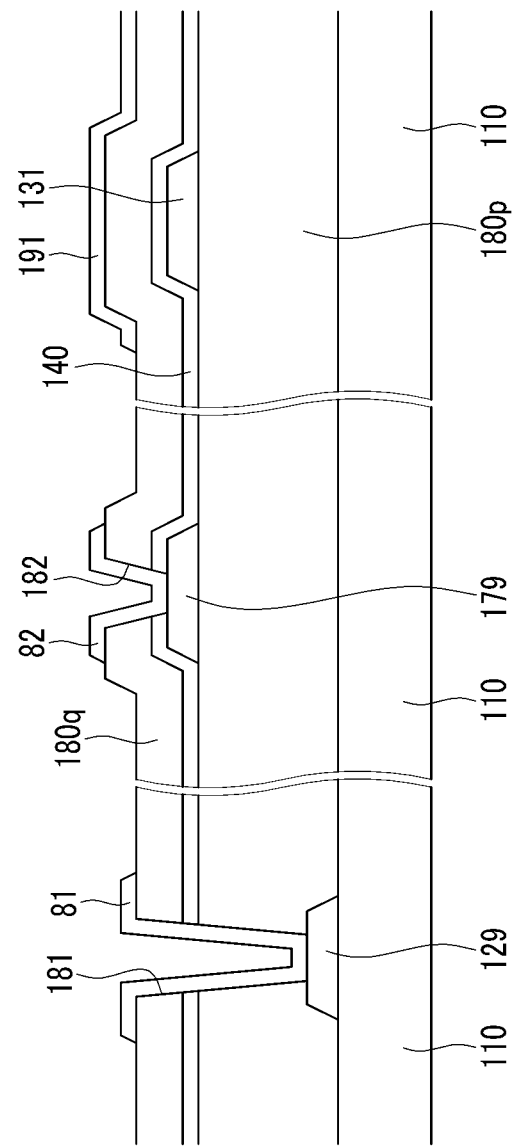
FIG. 7 is a cross-sectional view taken along the line VII-VII of FIG. 5.

As shown in FIG. 5, FIG. 6, and FIG. 7, a gate line 121 is formed on a transparent substrate 110. The gate line 121 for transmitting gate signals extends in a transverse direction and includes an end portion 129 having a wide width for connecting to another layer or an external driving circuit. The gate line 121 is made of copper and may be formed through sputtering or plating. When the gate line 121 is formed through plating, a seed layer may be formed under the copper layer. The seed layer may be made of Ti or Ni.

A first interlayer insulating layer 180p is formed on the gate line 121. The first interlayer insulating layer 180p may be made of an organic insulator and may planarize the insulation substrate 110. The organic insulator may be photosensitive and have a dielectric constant of about 4.0 or less. A gate electrode 124, a storage electrode line 131, and a data line 171 are formed on the first interlayer insulating layer 180p.

The gate electrode 124, the storage electrode line 131, and the data line 171 may contain a refractory metal such as Mo, Ta, Ti, or an alloy thereof and may have a multi-film structure that includes a refractory metal film (not shown) and a low resistance conductive layer (not shown). Examples of the multilayer may be a double layer (including a Cr or Mo (alloy) lower layer and an Al (alloy) upper layer) and a triple layer (including a Mo (alloy) lower layer, an Al (alloy) middle layer, and a Mo (alloy) upper layer). However, the data line 171 and the gate electrode 124 may be made of various other metals or conductors.

The data line 171 for transmitting data voltages extends substantially in the longitudinal direction, intersects the gate line 121, and includes an end portion 179 for connecting to other layers or an external driving circuit.

The storage electrode line 131 having an applied voltage during operation of the TFT display extends parallel to the data line 171, intersects the gate line 121, and includes a storage electrode 133 protruding right and left from the storage electrode line 131. The storage electrode line 131 may extend in the transverse direction along with the gate line 121.

A gate insulating layer 140 is formed on the gate electrode 124, the storage electrode line 131, and the data line 171. The gate insulating layer 140 may be made of silicon oxide (SiOx) or silicon nitride (SiNx). An oxide semiconductor 154 is formed on the gate insulating layer 140 using the method of FIG. 1, FIG. 2, and FIG. 3.

A second interlayer insulating layer 180q is formed on the oxide semiconductor 154. The second interlayer insulating layer 180q may be made of an inorganic material such as SiNx and SiOx. The second interlayer insulating layer 180q has a first contact hole 185a and a second contact hole 185b exposing the semiconductor 154. The second interlayer insulating layer 180q and the gate insulating layer 140 have contact holes 184 and 183b, respectively, exposing the data line 171 and the gate electrode 124, and the second interlayer insulating layer 180q, the gate insulating layer 140, and the first interlayer insulating layer 180p have a contact hole 183a exposing the gate line 121.

A pixel electrode 191 including a drain electrode 175, first and second connections 83 and 84, and contact assistants 81 and 82 are formed on the second interlayer insulating layer 180q.

The drain electrode 175 is connected to the oxide semiconductor 154 through the contact hole 185b, and the drain electrode 175 may be made of the same material as the pixel electrode 191 as one body.

The first connection 83 connects the gate electrode 124 and the gate line 121 to each other through contact holes 183a and 183b, and the second connection 84 connects the data line 171 and the oxide semiconductor 154 to each other through the contact holes 184 and 185a.

The gate electrode 124, the second connection 84, and the drain electrode 175, and the oxide semiconductor 154 form a TFT. The second connection 84 is used as a source electrode of the TFT, and the channel Q of the TFT is formed in the oxide semiconductor 154 between the second connection 84 and the drain electrode 175.

The signal of the gate line 121 is transmitted to the gate electrode 124 through the first connection 83, and the signal of the data line 171 is transmitted to the oxide semiconductor 154 through the second connection 84. If the gate signal is transmitted, the data signal is transmitted to the pixel electrode 191 through the second connection 84.

The pixel electrode 191, the first and second connections 83 and 84, and the contact assistants 81 and 82 may be made of a transparent conductive oxide such as indium tin oxide (ITO) or indium zinc oxide (IZO). In an exemplary embodiment of the present invention, the oxide semiconductor 154 is made of an oxide semiconductor that can be an ohmic contact such that the oxide semiconductor 154 is contacted directly to the conductive oxide forming the pixel electrode 191.

The pixel electrode 191 overlaps the storage electrode line 131 and the storage electrode 133, thereby forming a storage capacitor.

In an exemplary embodiment of the present invention, the first interlayer insulating layer 180p is made of an organic material disposed on the gate line 121, and the gate line 121 is made of low resistance copper. The first interlayer insulating layer 180p planarizes the insulation substrate 110 to smooth a step due to the thickness of the copper layer of the gate line 121. Also, the first interlayer insulating layer 180p is made of the organic material to eliminate parasitic capacitance due to the gate line 121 and reduces the signal delay of the gate line 121.

Also, in an exemplary embodiment of the present invention, the gate electrode 124 is formed on the first interlayer insulating layer 180p such that contamination of the gate electrode 124 by the organic material of the first interlayer insulating layer 180p may be prevented, thereby reducing deterioration of the TFT display quality.

Next, a manufacturing method of a TFT substrate will be described with reference to FIG. 8 to FIG. 15 as well as FIG. 6 and FIG. 7.

FIG. 8 to FIG. 15 are cross-sectional views taken along the lines VI-VI and VII-VII of FIG. 5 sequentially showing intermediate steps in a manufacturing method of a TFT array panel according to an exemplary embodiment of the present invention.

Figure 8:
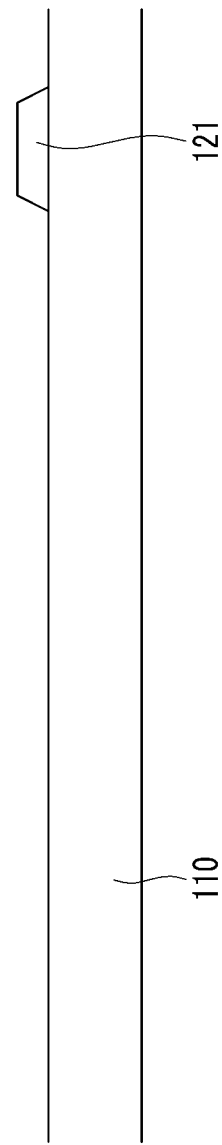
FIG. 8, FIG. 9, FIG. 10, FIG. 11, FIG. 12, FIG. 13, FIG. 14, and FIG. 15 are cross-sectional views sequentially showing a method for manufacturing the thin film transistor array panel shown in FIG. 5, FIG. 6, and FIG. 7 and taken along the lines VI-VI and VII-VII of FIG. 5.
Figure 9:
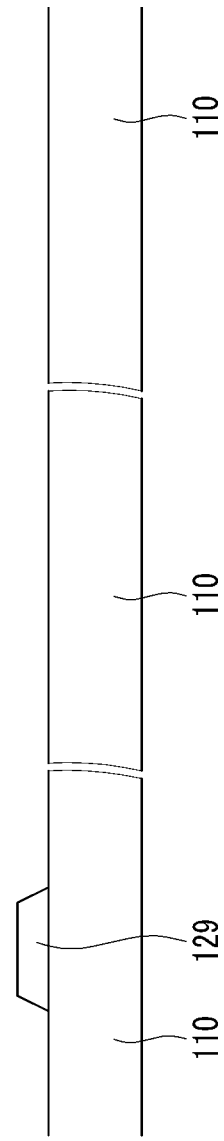

As shown in FIG. 8 and FIG. 9, a gate line 121 including an end portion 129 is formed on a substrate 110. A copper layer is deposited through a sputtering method and is patterned to form the gate line 121. The copper layer may also be formed through electroplating or electroless plating. Here, the copper is plated on a seed layer.

Figure 10:
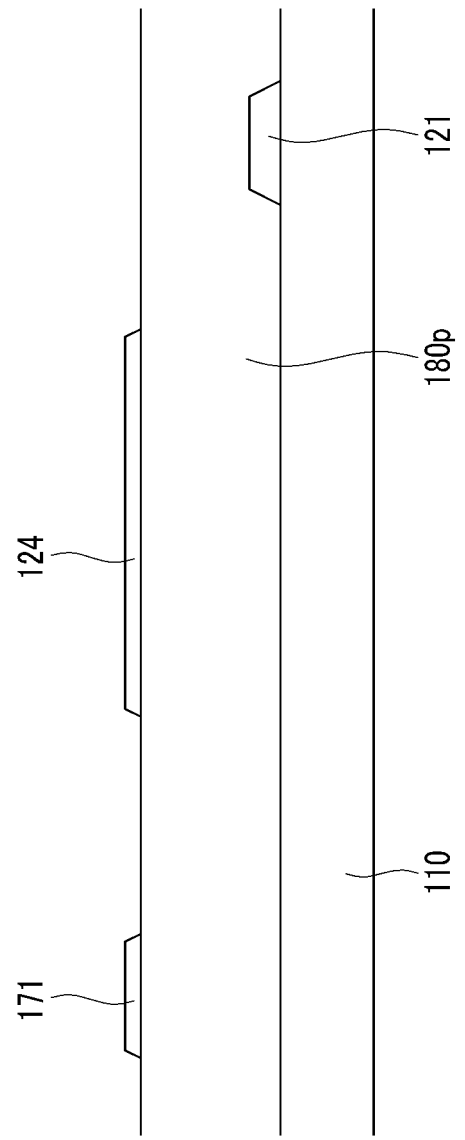
Figure 11:
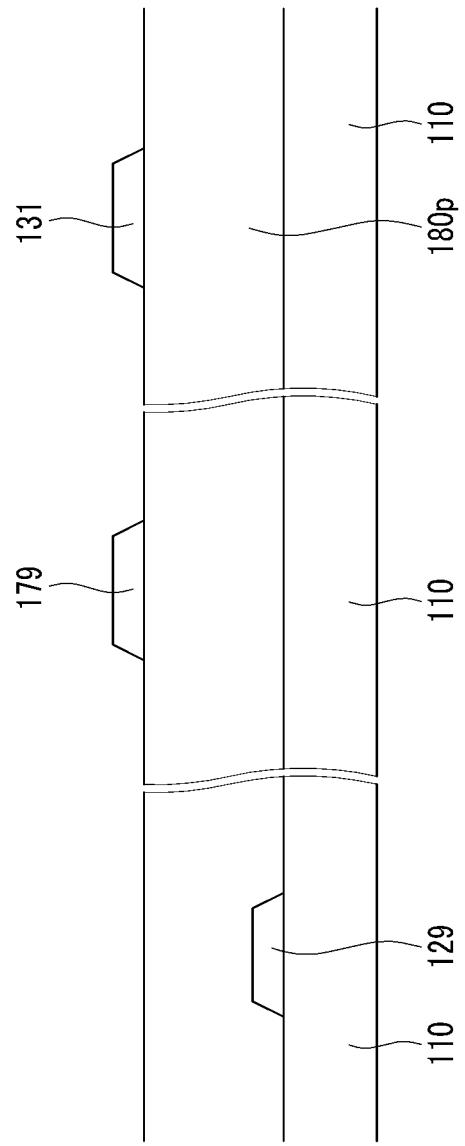

As shown in FIGS. 10 and 11, an organic material is coated on the gate line 121 to form the first interlayer insulating layer 180p. The first interlayer insulating layer 180p planarizes the insulation substrate 110. Next, a metal is deposited on the first interlayer insulating layer 180p and patterned to form a gate electrode 124, a storage electrode line 131, and a data line 171 including an end portion 179.

Figure 12:
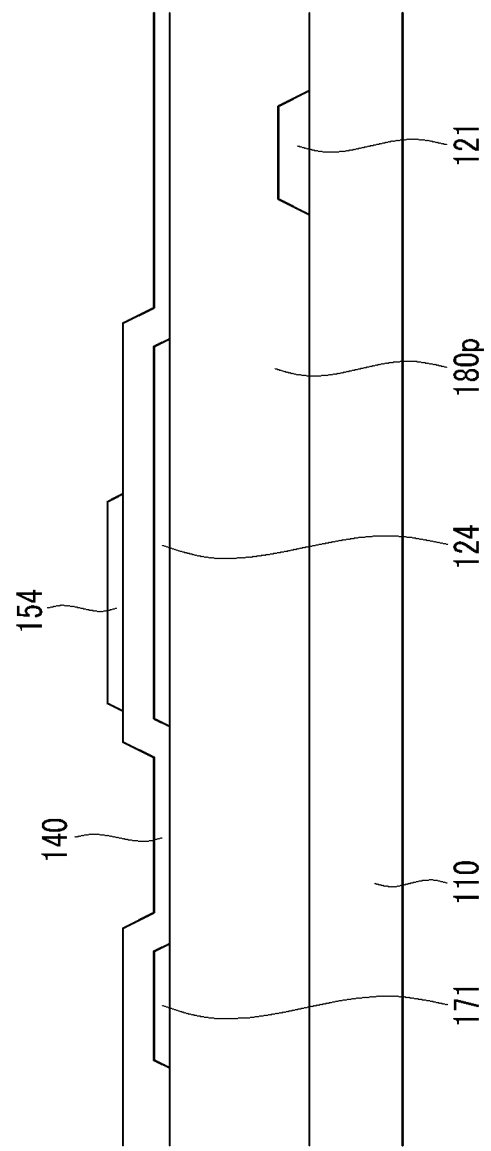
Figure 13:
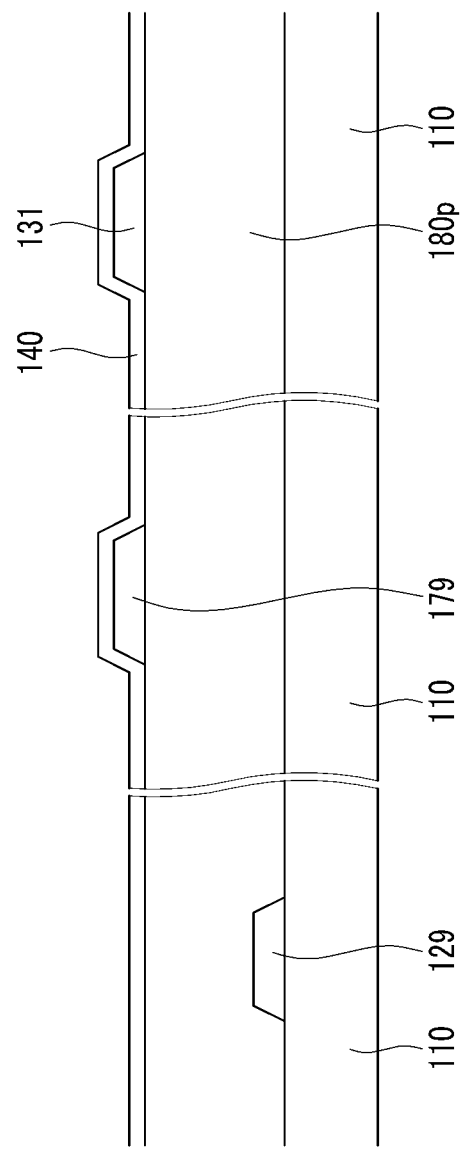

As shown in FIGS. 12 and 13, a gate insulating layer 140 is formed on the gate electrode 124, the storage electrode line 131, and the data line 171. Next, a precursor solution is coated on the gate insulating layer 140 to form a precursor layer (not shown). The precursor layer may be formed through the method as shown in FIG. 1.

Next, the solvent of the precursor layer is removed through heat treatment, and the laser irradiates a portion of the precursor layer by using a light exposer that includes a microlens array as shown in FIG. 2 to form an oxide semiconductor 154. Next, the precursor layer is removed to leave behind the newly formed oxide semiconductor 154 on the insulation substrate 110 as shown in FIG. 4.

Figure 14:
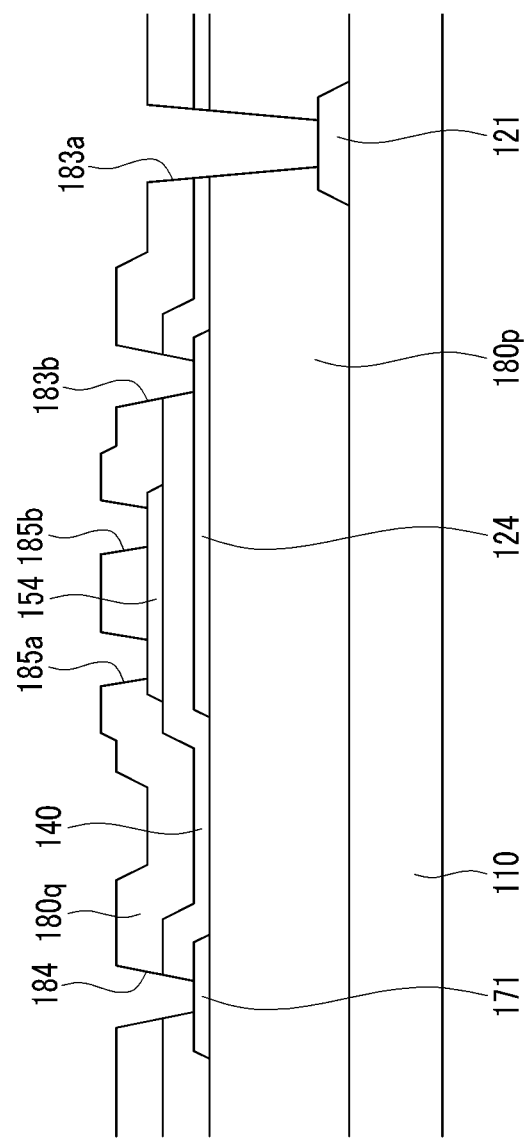
Figure 15:
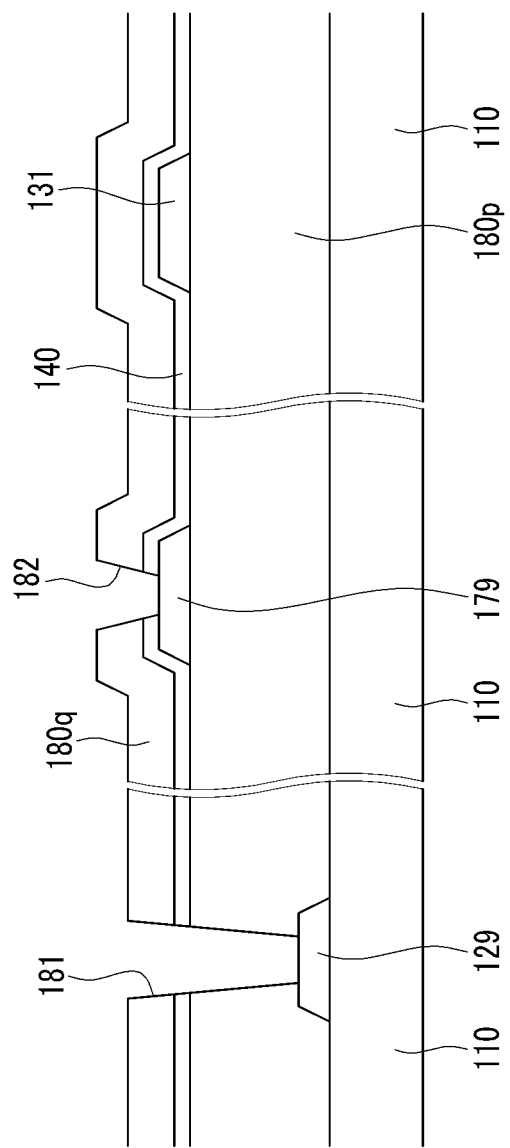

As shown in FIG. 14 and FIG. 15, the second interlayer insulating layer 180q is formed on the oxide semiconductor 154.

Next, the second interlayer insulating layer 180q, the gate insulating layer 140, and the first interlayer insulating layer 180p are etched to form the first and second contact holes 185a and 185b exposing the oxide semiconductor 154, contact holes 184 and 183b exposing the data line 171 and the gate electrode 124, and a contact hole 183a exposing the gate line 121.

Next, as shown in FIG. 6 and FIG. 7, a transparent conductive layer is formed on the second interlayer insulating layer 180q and is patterned to form a pixel electrode 191 connected to the oxide semiconductor 154 through the contact hole 185b, the first connection 83 connected to the gate electrode 124 and the gate line 121 through the contact holes 183a and 183b, the second connection 84 connected to the data line 171 and the semiconductor 154 through the contact holes 184 and 185a, and the contact assistants 81 and 82 connected to the end portions 129 and 179 of the gate line 121 and the data line 171 through contact holes 181 and 182.

Figure 16:
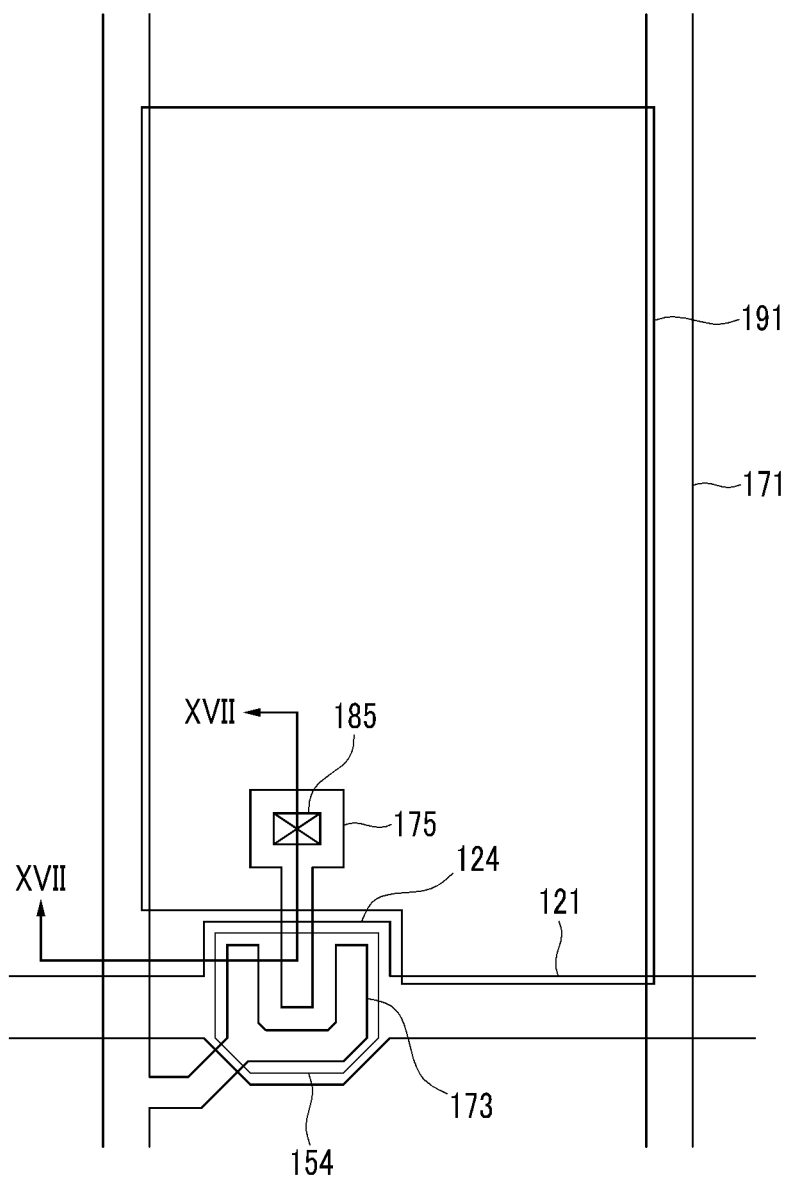
FIG. 16 is a layout view of a thin film transistor array panel for a liquid crystal display according to another exemplary embodiment of the present invention.
Figure 17:
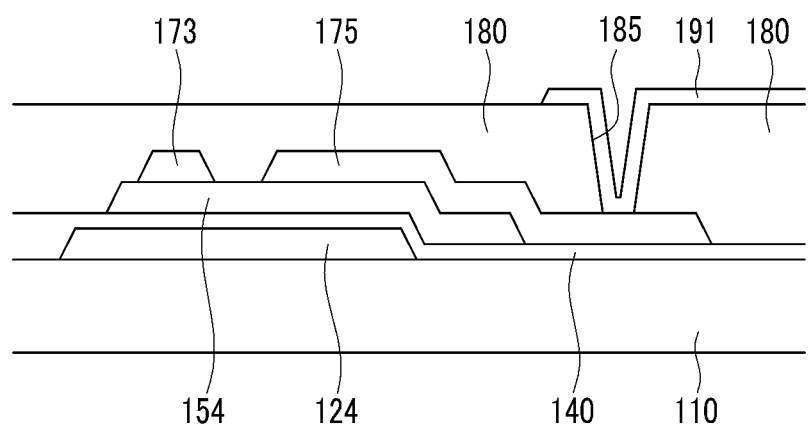
FIG. 17 is a cross-sectional view of the thin film transistor array panel taken along the line XVII-XVII of FIG. 16.

FIG. 16 is a layout view of a TFT array panel for a liquid crystal display according to another exemplary embodiment of the present invention, and FIG. 17 is a cross-sectional view of the TFT array panel taken along the line XVII-XVII of FIG. 16.

As shown in FIG. 16 and FIG. 17, a gate line 121 is formed in the transverse direction on the insulation substrate 110. A plurality of gate electrodes 124 protrude from the gate line 121.

The gate line 121 may include a conductive layer including an Al-based metal of Al or Al alloys or may have a multilayered structure including a conductive layer (not shown) having good electrical and physical contact properties with different materials, particularly ITO or IZO. Layers of the multilayer may contain materials such as Cr, Ti, Ta, Mo, and alloys thereof, for example, a MoW alloy. An example of the multilayer is a bilayer having a lower layer and an upper layer. The combination of the lower layer and the upper layer may be Al/Mo or Al—Nd/Mo. Also, the gate line 121 may be made of copper, as shown in FIG. 4, FIG. 5, and FIG. 6.

A gate insulating layer 140 is formed on the gate line 121, and an oxide semiconductor 154 is formed on the gate insulating layer 140. A data line 171 and a drain electrode 175 are formed on the oxide semiconductor 154 and the gate insulating layer 140. The data line 171 extends in the longitudinal direction and intersects the gate line 121. The data line 171 includes a source electrode 173 extending toward the drain electrode 175, and the source electrode 173 has a "U" shape. The drain electrode 175 is enclosed by the source electrode 173 as shown in FIG. 16. The data line 171 and the drain electrode 175 may be made of the same material as the gate line.

A passivation layer 180 is formed on the data line 171, the drain electrode 175, and the exposed oxide semiconductor 154. The passivation layer 180 includes a contact hole 185 exposing the drain electrode 175, and a pixel electrode 191 made of a transparent material such as IZO or ITO or an opaque metal is formed on the passivation layer 180. The pixel electrode 191 is connected to the drain electrode 175 through the contact hole 185 and receives the data voltage from the drain electrode 175.

The manufacturing method may be applied to any element of the display device including the semiconductor, the transistor, and the oxide semiconductor. Also, the present invention is not limited to the structure of the above-described exemplary embodiments and may include other structures of the transistor such as a top gate transistor or a bottom gate transistor.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method of manufacturing a transistor, comprising:
   forming a precursor layer by coating a surface of a substrate with a precursor solution for an oxide semiconductor;
   forming the oxide semiconductor by oxidizing a portion of the precursor layer;
   removing a remaining non-oxidized portion of the precursor layer using a solvent of the precursor solution;
   forming a gate electrode overlapping the oxide semiconductor, after removing the non-oxidized portion of the precursor layer; and
   forming a source electrode and a drain electrode overlapping the oxide semiconductor and facing the gate electrode.

2. The method of claim 1, wherein forming the precursor layer further comprises:
removing the solvent of the precursor layer by a heat treatment performed before forming the oxide semiconductor.

3. The method of claim 1, wherein oxidizing the portion of the precursor layer comprises irradiating the portion of the precursor layer with a laser.

4. The method of claim 3, wherein the irradiating comprises using a light exposer comprising a microlens array.

5. The method of claim 1, wherein coating the substrate comprises at least one of slit coating, area printing, inkjet printing, spin coating, dip coating, bar coating, screen printing, slide coating, roll coating, spray coating, dip-pen nanolithography, and nano-dispensing.

6. The method of claim 1, wherein the gate electrode, the source electrode, and the drain electrode comprise copper.

7. The method of claim 2, wherein the heat treatment is performed by heating the coated substrate at a temperature range of 90° C. to 110° C., for a time ranging from 80 seconds to 100 seconds.

8. The method of claim 1, wherein the solvent is an alcohol.

9. The method of claim 8, wherein the solvent comprises at least one compound selected from methanol, ethanol, propanol, isopropanol, 2-methoxyethanol, 2-ethoxyethanol, 2-propoxyethanol, 2-buthoxyethanol, butadiol, methylcellosolve, ethylcellosolve, ethyleneglycol, diethyleneglycolmethylether, diethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyllactic acid, propyleneglycolmethyletheracetate, propyleneglycolmethylether, propyleneglycolpropylether, methylcellosolveacetate, ethylcellosolveacetate, diethyleneglycolmethylacetate, diethyleneglycolethylacetate, acetone, methylisobutylketone, cyclohexanone, dimethyl formamide(DMF), N,N-dimethyl acetamide(DMAc), N-methyl-2-pyrolidone, γ-butyrolactone, diethylether, ethyleneglycoldimethylether, diglyme, tetrahydrofuran, acetylacetone, and acetonitrile.

10. The method of claim 4, wherein the irradiating comprises using radiation comprising a wavelength in the range of more than 100 nm to less than 500 nm.

11. The method of claim 1, wherein the precursor solution comprises a metal compound, a solution stabilizer, and a solvent, and the metal compound comprises at least one compound selected from a nitride, a salt, and a hydrate.

12. The method of claim 11, wherein:
the salt is selected from an acetate, a carbonyl, a carbonate, a nitrate, a sulfate, a phosphate, and a halide, and
a metal of the metal compound is selected from lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), Zinc (Zn), cadmium (Cd), mercury (Hg), boron (B), aluminum (Al), gallium (Ga), indium (In), thallium (Tl), silicon (Si), germanium (Ge), tin (Sn), lead (Pb), phosphorus (P), arsenic (As), antimony (Sb), and bismuth (Bi).

13. The method of claim 1, wherein the precursor layer comprises a thickness of more than 50 Å, and the substrate comprises a glass material or a plastic material.

\* \* \* \* \*